United States Patent [19]

Gupta et al.

[11] Patent Number: 6,026,222
[45] Date of Patent: Feb. 15, 2000

[54] SYSTEM FOR COMBINATIONAL EQUIVALENCE CHECKING

[75] Inventors: Aarti Gupta; Pranav N Ashar, both of Princeton, N.J.

[73] Assignee: NEC USA, Inc., Princeton, N.J.

[21] Appl. No.: 08/997,551

[22] Filed: Dec. 23, 1997

[51] Int. Cl.[7] .................................................. G06F 17/50
[52] U.S. Cl. .............................. 395/500.06; 395/500.04; 395/500.19
[58] Field of Search .......................... 395/500.02–500.09

[56] References Cited

U.S. PATENT DOCUMENTS

| | | | |
|---|---|---|---|
| 5,649,165 | 7/1997 | Jain et al. | 395/500.06 |
| 5,754,454 | 5/1998 | Pixley et al. | 702/123 |
| 5,909,374 | 6/1999 | Matsunaga | 395/500.06 |

OTHER PUBLICATIONS

Ashar et al., "Boolean satisfiability and equivalence checking using general binary decision diagrams", Proceedings, 1991 IEEE International Conference on Computer Design: VLSI in Computers and Processors, pp. 259–264, Oct. 14, 1991.

J. P. Billon, et al. "Original concepts of PRIAM, an industrial tool for efficient formal verification Of combinational circuits." In *Fusion of Hardware Design and Verification*, pp. 487–501, G. J. Milne, ed. North–Holland, Amsterdam, 1988, Jul. 4,1988.

C. Berman et al. Functional comparison of logic design for VLSI circuits. In Proceedings of the IEEE International Conference on Computer–Aided Design, pp. 456–459. EKE Computer Society Press, Los Alamitos, CA, Nov. 1989.

D. Brand. Verification of large synthesized designs. In Proceedings of the IEEE International Conference on Computer–Aided Design, pp. 534–537, Nov. 1993.

F. Brglez et al. Combinational Profiles of Sequential Benchmark Circuits. In Proceedings of the International Symposium on Circuits and Systems, Portland, Oregon, May 1989.

R. E. Bryant. Graph–based algorithms for Boolean function manipulation. *IEEE Transactions on Computers*, C–35(8):677–691, Aug. 1986.

R. E. Bryant. On the complexity of VLSI implementations and graph representations of Boolean functions with application to integer multiplication. *IEEE Transactions on Computers*, 40(2):205–213, Feb. 1991.

E. Cerny et al. Tautology checking using cross–controllability and cross–observability relations. In Proceedings of the IEEE International Conference on Computer–Aided Design, pp. 34–37, IEEE Computer Society Press Los Alamitos, CA, Nov. 1990.

S. Chakradhar et al. A transitive closure algorithm for test generation. *IEEE Transactions on Computer–Aided Design of Integrated Circuits and Systems*, 12(7):1015–1028, Jul. 1993.

M. Fujita et al. Evaluation and improvements of a Boolean comparison program based on Binary Decision Diagrams. In Proceedings of the IEEE International Conference on Computer–Aided Design, pp. 2–5. EKE Computer Society Press, Los Alamitos, CA, 1988.

(List continued on next page.)

*Primary Examiner*—Kevin Teska
*Assistant Examiner*—Phallaka Kik
*Attorney, Agent, or Firm*—Sughrue, Mion, Zinn, Macpeak & Seas, PLLC

[57] ABSTRACT

A computer system, computer program product, and method for solving a combinational logic verification problem with respect to two combinational circuits includes Boolean SAT checking integrated with binary decision diagrams (BDD) use. A fanout partition of a miter circuit formed from the two combinational circuits is reduced to BDD form, while the fanin partition is represented by SAT clauses. As SAT solutions are evaluated, variables in the cutset between the fanout and fanin partitions are assigned values. In a preferred embodiment, each assignment to a cutset variable is checked against an onset of the BDD prior to continuing with SAT solution seeking.

9 Claims, 8 Drawing Sheets

OTHER PUBLICATIONS

H. Fujiwara. Fan: A fanout–oriented test pattern generation algorithm. In Proceedings of the 1985 International Symposium on Circuits and Systems, pp. 671–674, Jul. 1985.

P. Goel. An implicit enumeration algorithm to generate tests for combinational logic circuits. In *IEEE Transactions on Computers*, vol. C–30, pp. 215–222, Mar. 1991.

J. Jain et al. Advanced verification techniques based on learning. In Proceedings of the 32nd ACM/IEEE Design Automation Conference, pp. 420–426. EKE Computer Society Press, Los Alamitos, CA, Jun. 1995.

A. Kuehlmann et al. Equivalence checking using cuts and heaps. In Proceedings of the 34th ACM/IEEE Design Automation Conference, pp. 263–268. EKE Computer Society Press, Los Alamitos, CA, Jun. 1997.

W. Kunz et al. Recursive learning: A new implication technique for efficient solutions to cad problems—test, verifications and optimization.

T. Larrabee. Test pattern generation using boolean satisfiability. *IEEE Transactions on Computer–Aided Design of Integrated Circuits and Systems*, 11(1):4–15, Jan. 1992.

Madre et al., "Autometing the Diagnosis and the Rectification of Design Errors with PRIAM", IEEE, pp. 30–33, Jan. 1989.

S. Malik et al. Logic verification using Binary Decision Diagrams in a logic synthesis environment. In Proceedings of the IEEE International Conference on Computer–Aided Design, pp. 6–9. EKE Computer Society Press, Los Alamitos, CA, 1988.

Y. Matsunaga. An efficient equivalence checker for combinational circuits. In Proceedings of the ACM/IEEE Design Automation Conference, pp. 629–634. IEEE Computer Society Press, Los Alamitos, CA, Jun. 1996.

D. Pradhan et al. Verilat: Verification using logic augmentation and transformations. In Proceedings of the IEEE International Conference on Computer–Aided Design, pp. 88–95. IEEE Computer Society Press, Los Alamitos, CA, Nov. 1996.

M. Schulz et al. Socrates: A highly efficient atpg system. *IEEE Transactions on Computer–Aided Design of Integrated Circuits and Systems*, 7(1): 126–137, Jan. 1988.

E. M. Sentovich et al. Sequential circuit design using synthesis and optimization. In Proceedings of the IEEE International Conference on Computer Design, 1992.

J. P. M. Silva et al. Grasp: A new search algorithm for satisfiability. In Proceedings of the IEEE International Conference on Computer–Aided Design, pp. 220–227. IEEE Computer Society Press, Los Alamitos, CA, Nov. 1996.

Long. BDD Package. Unpublished. School of Computer Science, Carnegie Mellon University, Pittsburgh Prior Art 1993, Jun. 11, 1993.

Kunz et al. A Novel Framework for Logic Verification in a Synthesis Environment. In *IEEE Transactions on Computer–Aided Design of Integrated Circuits and Systems*, vol. 15, No. 1, Jan. 1996.

P. Stephan et al. Combinational test generation using satisfiability. *IEEE Transactions on Computer–Aided Design of Integrated Circuits and Systems*, 15(9): 1167–1176, Sep. 1996.

Fig. 5

```
sat_branch (sat)

{
/* find the next literal to bound */
lit = find_next_lit(sat);
if (lit = = NIL) {
        /* SAT solution is found */
        if (check_consistency_with_cutset_bdd(sat))
                return success;
        else
                return failure;
}

/* try positive value of lit */
if (sat_bound(sat, lit) && sat_branch(sat))
    return success;

/* previous branch failed; backtrack */
undo_lit_assignment(sat);
/* try negative value of lit */
if (sat_bound(sat, neg(lit)) && sat_branch(sat))
        return success;

return failure;

```
sat_bound(sat, lit, bdd)
{
        if (lit_is_a_cutset_variable(lit)) {
                new_bdd = project_variable_in_bdd(bdd, lit);
                if (bdd_equal(new_bdd, Zero_bdd))
                        return failure;
                else
                        bdd = new_bdd;
        }
        /* rest of the procedure is unchanged */
        ...
} sat_branch(sat, bdd)
{
        /* find the next literal to bound */
        lit = find_next_lit(sat);
        if (lit == NIL) {
                /* SAT solution is found */
                return success;
        }
        old_bdd = bdd;
        /* try positive value of lit */
        if (sat_bound(sat, lit, bdd) && sat_branch(sat, bdd))
                return success;
        /* previous branch failed; backtrack */
        undo_lit_assignment(sat);
        bdd = old_bdd;
        /* try negative value of lit */
        if (sat_bound(sat, neg(lit), bdd) && sat_branch(sat, bdd))
                return success;
        return failure;
}
```

Fig. 8

```
bdd_project_variable(association, variable_bdd, value_bdd)
{
        /* use var_index to index into the association */
        i = bdd_var_index(variable_bdd);
        association[i] = value_bdd;
} bdd_unproject_variable(association, variable_bdd)
{
        /* invalidate value of the variable in the association */
        i = bdd_var_index(variable_bdd);
        association[i] = 0;
} bdd_check_intersection(arg_bdd, association) {
        /* check for terminal nodes */
        if (arg_bdd == BDD_ZERO)
                return (zero);
        if (arg_bdd == BDD_ONE)
                return (non_zero);
        /* return stored result in user-defined field if top node has been visited earlier */
        if (BDD_MARK(arg_bdd)) {
                return(BDD_UDF(arg_bdd));
        }
        /* obtain the association of top variable, if any */
        i = bdd_var_index(arg_bdd);
        value_bdd = association[i];
        /* perform the check recursively by taking appropriate edges */
        if (value_bdd == BDD_ONE) {
                result = bdd_check_intersection(BDD_THEN(arg_bdd), association);
        }
        else if (value_bdd == BDD_ZERO {
                result = bdd_check_intersection(BDD_ELSE(arg_bdd), association);
        }
        else {
                result = bdd_check_intersection(BDD_THEN(arg_bdd), association);
                if (result == zero) {
                        result = bdd_check_intersection(BDD_ELSE(arg_bdd), association);
                }
        }
        /* save results in user-defined field */
        BDD_UDF(arg_bdd) = result;
        return(result);
}
```

SYSTEM FOR COMBINATIONAL EQUIVALENCE CHECKING

BACKGROUND OF THE INVENTION

1. Field of the Invention

This invention relates to a system for checking the equivalence of combinational circuits. More particularly, this invention relates to a system for checking such equivalence which is more robust than other systems heretofore achieved, and which accommodates the checking of complex circuits having substantial dissimilarities. The invention is embodied in a system, a method, and a program product for combinational equivalence checking.

2. Background and Related Art

A combinational circuit, as the term is used herein, is a circuit having a network of interconnected logic gates. Combinational circuits may be represented by logic netlists. A given combinational circuit has a fanin and a fanout. The fanin of a combinational circuit relates, in general, to the inputs provided to the combinational circuit. The fanout of a combinational. circuit relates to the set of outputs given by the combinational circuit. Thus, from a given point in a combinational circuit, the fanin side of the combinational circuit is the side closer to the inputs, and the fanout side is the side closer to the outputs. The relationship of the combinational circuit outputs to the combinational circuit inputs defines the overall functionality of the combinational circuit.

It is well known that, to design a combinational circuit with a predetermined overall functionality, many different combinational circuit structures are possible. In other words, two combinational circuits may structurally be very different in terms of the exact network of interconnected logic gates used, but may actually have an identical overall functionality.

Digital design involves the creation of combinational circuits. Frequently, digital design also involves the modification of an existing combinational circuit. Sometimes, it is desirable to modify an existing combinational circuit in only a structural manner, leaving the overall functionality of the changed combinational circuit the same as that of the existing combinational circuit.

Combinational circuits can be extremely complex, and the verification that one combinational circuit has the identical overall functionality of another combinational circuit is an important problem. This problem will be referred to as the combinational logic verification problem. This problem applies equally to the situation in which it is desired to verify that a node in one combinational circuit, as opposed to the combinational circuit as a whole, provides the same overall functionality as a node in another combinational circuit. Thus, it will be appreciated that the combinational logic verification problem relates to combinational circuits as a whole, and also to smaller combinational circuits within larger combinational circuits.

Below, the terms combinational circuits and nodes of combinational circuits will usually be interchangeably used. The two terms will usually be interchangeable because of the simple fact that a large logic netlist will always have nodes within it, and each of the nodes may define a smaller part of the overall combinational circuit which itself, taken alone, could be taken as a combinational circuit.

The combinational logic verification problem may be framed, conceptually, in terms of what is known in the art as a miter circuit. FIG. 1 illustrates a miter circuit 10. In FIG. 1, Circuit 1 and Circuit 2 are combinational circuits. It is desired to verify whether Circuit 1 and Circuit 2 are equivalent, i.e., whether the two combinational circuits have an identical overall functionality. In the example of FIG. 1, each of the two combinational circuits receives identical inputs w and x. Circuit 1 has, as a respective output, output y. Circuit 2 has, as a respective output, output y'. The nodes to be checked for equivalence provide their respective outputs y and y' to an XOR gate. The output of the XOR gate is output z. As useful background on the miter circuit, the following document is incorporated by reference:

D. Brand. Verification of large synthesized designs. In *Proceedings of the IEEE International Conference on Computer-Aided Design*, pages 534–537, November 1993.

As it will be appreciated, for every possible set of inputs w and x, if the combinational circuits are equivalent, outputs y and y' should always be identical. Whenever outputs y and y' are identical, the output z of the XOR gate will be 0. If, however, it is possible to obtain a 1 at output z, then the circuits are not perfectly equivalent.

The miter circuit 10 provides a unifying theme throughout the various approaches to solving the combinational logic verification problem.

One approach to solving the combinational logic verification problem is a structural approach. Under the structural approach, the miter circuit is used in an inner loop of an iterative equivalence checking framework. That is, nodes from Circuit 1 and Circuit 2 are compared. Nodes found to be equivalent are replaced, and the equivalence checking proceeds in a bottom up manner. As more nodes in each of the circuits are replaced, it becomes more possible to achieve a simplified check of the primary outputs. This structural approach, or iterative replacement approach, works well when Circuit 1 and Circuit 2 are structurally similar. The following documents are incorporated by reference for their useful background material on the structural approach:

C. Berman and L. H. Trevyllian. Functional comparison of logic design for VLSI circuits. In *Proceedings of the IEEE International Conference on Computer-Aided Design*, pages 456–459. EKE Computer Society Press, Los Alamitos, Calif., November 1989.

E. Cerny and C. Mauras. Tautology checking using cross-controllability and cross-observability relations. In *Proceedings of the IEEE International Conference on Computer-Aided Design*, pages 34–37. IEEE Computer Society Press, Los Alamitos, Calif., November 1990.

J. Jain, R. Mukherjee, and M. Fujita. Advanced verification techniques based on learning. In *Proceedings of the $32^{nd}$ ACM/IEEE Design Automation Conference*, pages 420–426. EKE Computer Society Press, Los Alamitos, Calif., June 1995.

W. Kunz and D. Pradhan. Recursive learning: A new implication technique for efficient solutions to CAD problems—test, verification and optimization. *IEEE Transactions on Computer-Aided Design of Integrated Circuits and Systems*, 13(9):1143–1158, September 1994.

Y. Matsunaga. An efficient equivalence checker for combinational circuits. In *Proceedings of the ACM/IEEE Design Automation Conference*, pages 629–634. IEEE Computer Society Press, Los Alamitos, Calif., June 1996.

D. Pradhan, D. Paul, and M. Chatterjee. Verilat: Verification using logic augmentation and transformations.

In *Proceedings of the IEEE International Conference on Computer-Aided Design*, pages 88–95. IEEE Computer Society Press, Los Alamitos, Calif., November 1996.

S. M. Reddy, W. Kunz, and D. Pradhan. Novel verification framework combining structural and OBDD methods in a synthesis environment. In *Proceedings of the 32$^{nd}$ ACM/IEEE Design Automation Conference*, pages 414–419. IEEE Computer Society Press, Los Alamitos, Calif., June 1995.

Although combinational circuits sought to be compared may often be similar, there are many instances in which one circuit is much different from another. For example, when circuits are redesigned using automated design software, the redesigned circuit may have very little structural similarity to the original circuit. In such a case, the iterative replacement approach becomes very difficult because it is harder to pick out nodes in each of the two combinational circuits that actually are equivalent. The particular methods recommended in the above-identified background documents fail when there is little internal correspondence to exploit.

Another approach to the combinational logic verification problem is a functional approach. Under the functional approach use is made of binary decision diagrams (BDDs). A BDD results from reducing the entire combinational circuit to a canonical form. The following documents are incorporated by reference in their entirety as providing useful background information concerning function-based approaches:

J. P. Billon and J. C. Madre. Original concepts of PRIAM, an industrial tool for efficient formal verification of combinational circuits. In G. J. Milne, editor, *Fusion of Hardware Design and Verification*, pages 487–501. North-Holland, Amsterdam, 1988.

M. Fujita, H. Fujisawa, and N. Kawato. Evaluation and improvements of a Boolean comparison program based on Binary Decision Diagrams. In *Proceedings of the IEEE International Conference on Computer-Aided Design*, pages 2–5. EKE Computer Society Press, Los Alamitos, Calif., 1988.

S. Malik, R. K. Wang, A. Brayton, and A. Sangiovanni-Vincentelli. Logic verification using Binary Decision Diagrams in a logic synthesis environment. In *Proceedings of the IEEE International Conference on Computer-Aided Design*, pages 6–9. EKE Computer Society Press, Los Alamitos, Calif., 1988.

Once each combinational circuit is reduced to a BDD, the problem of checking for equivalence is changed from the complex problem of comparing two different combinational circuits to the more simple problem of comparing two canonical data structures (i.e., BDDs).

The functional approach has shortcomings, however. Usually, a function-based approach uses some variant of the Reduced Ordered BDD (ROBDD). The ROBDD is discussed below, but additional background information on this topic may be found in the following document which is herein incorporated by reference: R. E. Bryant, Graph-based algorithms for Boolean function manipulation, *IEEE Transactions on Computers*, C-35(8):677–691, August 1986. In particular, such BDDs grow exponentially in terms of the number of input variables for certain very commonly used logic functions like multipliers, as described in the following document now incorporated by reference for its background information in this regard:

R. E. Bryant. On the complexity of VLSI implementations and graph representations of Boolean functions with application to integer multiplication. *IEEE Transactions on Computers*, 40(2):205213, February 1991.

Thus, such BDDs do not scale well, even for random logic. In other words, the larger the combinational circuit, the larger the BDDs, and the more difficult it becomes to use the functional approach. It is substantially impractical to use the functional approach to solve the combinational logic verification problem for very large combinational circuits.

Thus, the structural approach becomes impractical when the two combinational circuits are structurally dissimilar. The functional approach becomes impractical when the two combinational circuits are very large.

SUMMARY OF THE INVENTION

It is thus an object of the invention to provide a robust and practical approach to solving the combinational logic verification problem for two circuits even when they are structurally dissimilar and very large.

The invention is realized in a method for determining non-equivalence between two combinational circuits. In the method according to the invention, the two combinational circuits are combined into a miter circuit; the miter circuit is partitioned along a boundary which separates each of the two combinational circuits into a respective fanin partition and a respective fanout partition, there being a set of cutset variables defined by said boundary; a canonical binary decision diagram is defined for the respective fanout partitions, the canonical binary decision diagram having a respective binary decision diagram onset; a set of Boolean satisfiability clauses is defined for the respective fanin partitions, the Boolean satisfiability clauses having the cutset variables as an output, the canonical binary decision diagram having the cutset variables as an input; Boolean satisfiability checking is performed to find satisfiability solutions for the set of Boolean satisfiability clauses, including bounding values to variables included in the set of Boolean satisfiability clauses; and, whenever one of the variables bound to a value is one of the set of cutset variables, the values of the set of cutset variables are checked to make a determination as to whether the values of the set of cutset variables have a non-null intersection with the binary decision diagram onset. The invention also involves a computer system and a computer program product for implementing the foregoing method.

BRIEF DESCRIPTION OF THE DRAWINGS

FIG. 5 shows pseudo-code for one approach to integrating satisfiability checking and BDDs.

FIG. 6 shows pseudo-code for an early bounding approach to integrating satisfiability checking and BDDs.

FIG. 8 shows pseudo-code for special BDD operations.

DETAILED DESCRIPTION OF THE PREFERRED EMBODIMENTS

Figure 1:
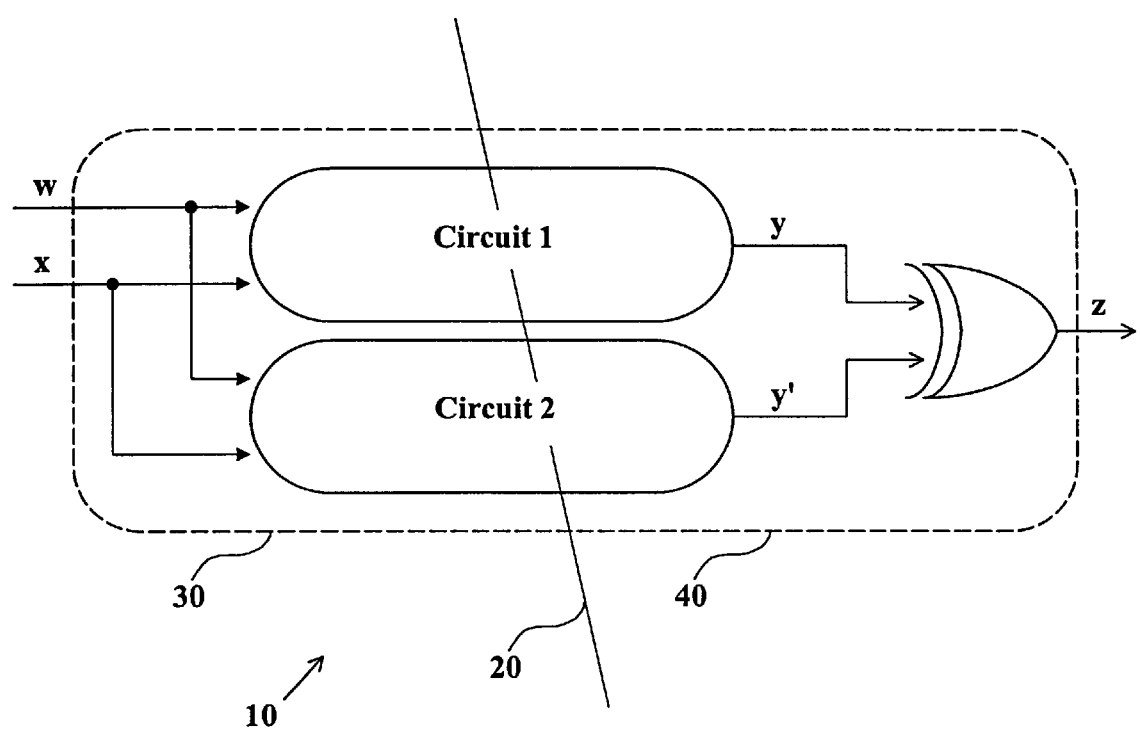
FIG. 1 shows a hybrid approach for solving the combinational logic verification problem in accordance with the invention.

The invention will now be described with reference to an example as shown in FIG. 1, after some preliminary discussion of BDDs.

Figure 7:
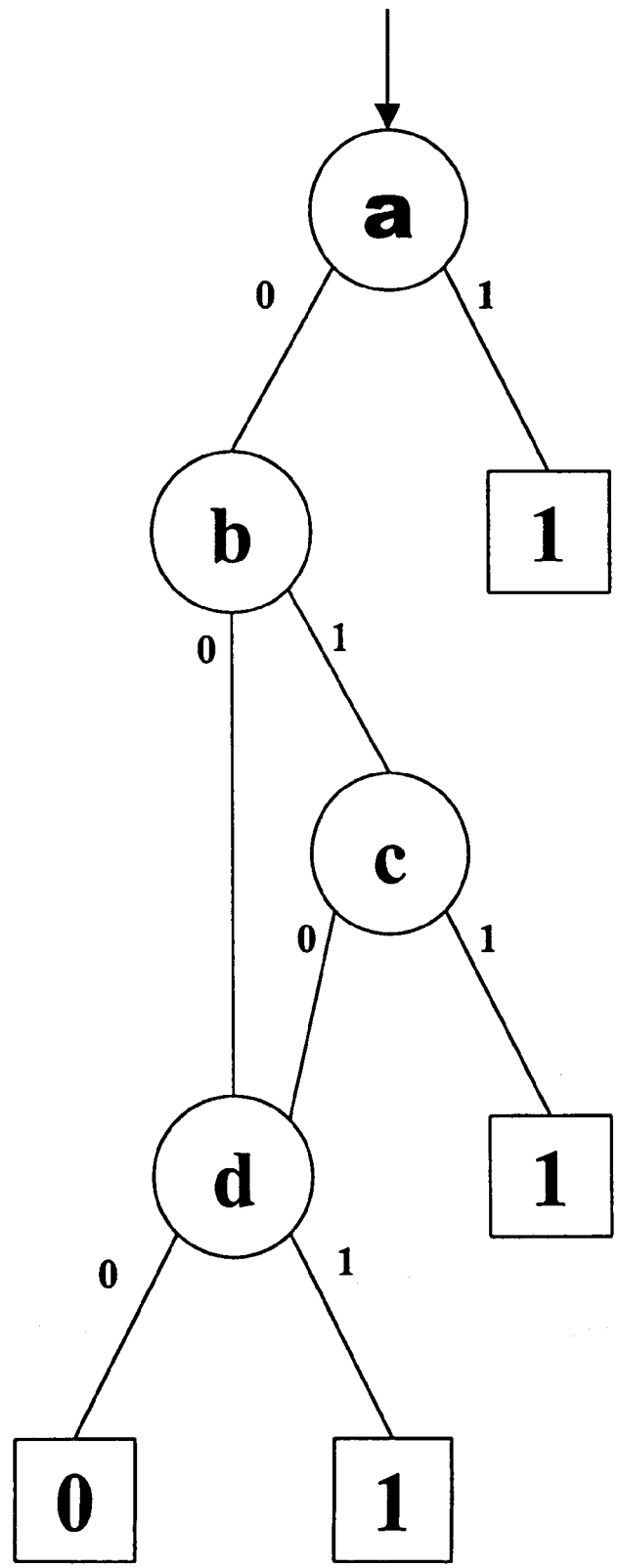
FIG. 7 shows an example of a BDD.

A BDD represents a Boolean function as a rooted, directed acyclic graph (DAG), e.g., as shown in FIG. 7. More particularly, FIG. 7 shows a reduced ordered BDD representation for the example Boolean function of $f=a \wedge (b \vee c) \wedge d$. Each non-terminal node v is labeled by a Boolean variable var(v), and has two outgoing edges to nodes BDD_THEN(v) and BDD_ELSE(v), corresponding to the variable being true or false, respectively. Each terminal node represents a Boolean constant, and is labeled 1 (BDD_ONE) or 0 (BDD_ZERO).

A Boolean functions $f_v$ is associated with each node v of a DAG, such that:

if v is a terminal node, $f_v=1$ or $f_v=0$, depending on the Boolean constant that v represents.

if v is a non-terminal node labeled by variable x, $f_v = (\neg x \vee f_0) \wedge (x \vee f_1)$, where $f_0$ denotes the function associated with node BDD_ELSE(v), and $f_1$ represents the function associated with node BDD_THEN(v).

An Ordered BDD is a BDD with the additional constraint that all directed paths in the DAG consist of non-terminal nodes in an ascending order, specified as a total ordering on the set of variables. The DAG representing an Ordered BDD can further be reduced by (i) removing duplicate nodes, i.e., other nodes that represent the same triple (var(v), BDD_THEN(v), BDD_ELSE(v)), and (ii) removing nodes with a redundant test, i.e., removing a node v where BDD_THEN(v)=BDD_ELSE(v). It has been shown that a ROBDD is a canonical representation for a Boolean function. In the remainder of this document, a BDD is regarded as being ordered and reduced, unless otherwise stated.

It will be recalled that, in FIG. 1, two combinational circuits are to be checked for equivalency. In this example, Circuit 1 and Circuit 2 are too large for the functional approach to be practical and are too structurally dissimilar for the structural approach to be practical. Thus, the two combinational circuits do not lend themselves well to either the functional approach or the structural approach. It will be appreciated, however, that the invention is equally applicable to combinational circuits that are structurally similar or not so large.

According to preferred embodiment of the invention, as large of a BDD as is practically possible is first produced by working backward from the miter output z toward inputs w and x. Here, by the term "as large . . . as is practically possible" means substantially the largest BDD that can be produced in view of the available hardware and software support. It is not essential to the invention that the BDD be absolutely the largest BDD that is practically possible. Any size of BDD is acceptable, and still is in keeping with the invention. The larger the BDD, however, the greater gains in terms of speed of solving the combinational logic verification problem.

Circuit 1 and Circuit 2 are so large, however, that the BDD does not include all of either circuit. The BDD includes only part of each of the combinational circuits. In FIG. 1, boundary 20 separates the parts of the combinational circuits which have been represented in a BDD from the parts which have not been represented in a BDD. More particularly, section 40 of miter circuit 10 indicates the parts of the combinational circuits which are taken into account by the largest practical BDD, and will hereafter be referred to as fanout partition 40. Section 30 of miter circuit 10 indicates the parts of the combinational circuits which are not included in the BDD, and will hereafter be referred to as fanin partition 30.

In other words, the combinational circuits are partitioned (by boundary 20) into a fanin partition 30 and a fanout partition 40. The fanout partition 40 is reduced to a BDD.

A description will now be made of Boolean satisfiability as it pertains to the invention.

Boolean satisfiability is a method for finding variable values that satisfy a logic formula given as a conjunctive normal form (CNF) data structure. A SAT solver or SAT checker is a program product that performs a Boolean satisfiability method. Various efficient algorithms for SAT checking are known, and so the specifics of SAT checking are not herein further described. The following background documents on SAT are thus incorporated by reference:

T. Larrabee. Test pattern generation using Boolean satisfiability. *IEEE Transactions on Computer-Aided Design of Integrated Circuits and Systems,* 11 (1):4–15, January 1992.

J. P. M. Silva and K. A. Sakallah. Grasp: A new search algorithm for satisfiability. In *Proceedings of the IEEE International Conference on Computer-Aided Design,* pages 220–227. IEEE Computer Society Press, Los Alamitos, Calif., November 1996.

P. Stephan, R. K. Brayton, and A. Sangiovanni-Vincentelli. Combinational test generation using satisfiability. *IEEE Transactions on Computer-Aided Design of Integrated Circuits and Systems,* 15(9): 1167–1176, September 1996.

The SAT-solver uses a systematic backtracking procedure to obtain a variable assignment for which the CNF formula evaluates to 1 ("truth"). The efficiency of this approach derives from the fact that dependencies between variables can be extracted readily from the CNF representation. This allows non-local dependencies between variables to be derived very rapidly. This ability to capture non-local implications efficiently, in turn, allows contradictions in variable assignments during a backtracking procedure to be determined early and rapidly. Various data structure schemes can be used internal to the SAT-solver to represent the CNF formula and the information contained in it. Without lack of generality, the following sections assume a clause-based approach which uses a list of clauses internally.

The means used to express a problem in CNF differ depending on the problem domain. Finding a satisfying assignment for the CNF formula once the problem has been mapped into that form will be focused on here. Overall, the approach is to systematically assign values to variables one-by-one using a decision tree, and to evaluate their implications on the rest of the clauses in the formula. A contradiction is said to occur when a transitive implication exists from one literal to a literal of the same variable with opposite polarity. (Intuitively, $a \Rightarrow \overline{a}$ is contradictory.) A contradiction before the backtracking procedure is begun indicates an unsolvable CNF. A contradiction after some partial assignments indicates that the search can be stopped at that point for these partial assignments. That is, some of the values assigned to variables are leading to a nonsensical solution. The process of identifying implications and stopping the search on a contradiction can loosely be called bounding.

Each step of the backtracking procedure involves two steps: (1) choosing a variable to branch on and setting a value for it, and (2) updating the CNF formula based on the imposition of this variable value until a fixed point is reached as before. If Step (2) leads to a contradiction, the search can be stopped at this point and the algorithm can backtrack. When a variable is arrived at, there are three possibilities: (a) it may have no value assigned to it yet, (b) the system may be backtracking on the first assignment to the variable, or (c) the system may be backtracking on the second assignment to the variable. In case (a), the system can choose to assign either value to the variable. In case (b), the system must assign a value that is the opposite of the previous assignment. In case (c), the system must backtrack to the previous variable in the decision tree. The algorithm completes when either all clauses are satisfied or when the search space is exhausted. Various heuristics can be used to pick the next variable and value to branch on. A common strategy is to pick the literal that occurs in the largest number of clauses.

Below, there is shown the derivation of a CNF formula for a small instance of a typical application of SAT, and how a SAT Checker might go about finding a satisfying assignment.

Figure 2:
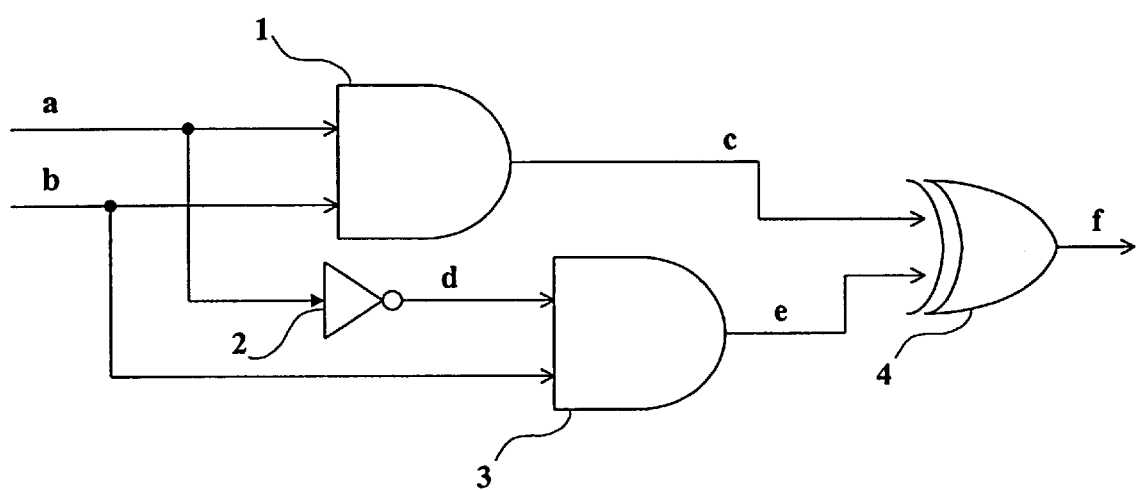
FIG. 2 shows an example circuit used to explain Boolean satisfiability checking.

An example of the derivation of a CNF formula for a combinational circuit or a part thereof is now given with reference to FIG. 2. The CNF formula for the circuit is built bottom-up from inputs to outputs. Each gate in the circuit contributes clauses encapsulating all the valid input-output combinations for the gate. In the example, Gate 1 (an AND gate) with inputs a and b, and output c, contributes the following clauses:

$$(a+\bar{c})(b+\bar{c})(\bar{a}+\bar{b}+c) \qquad (1)$$

Gate 2 (a NOT gate) with input b and output c, contributes:

$$(b+d)(\bar{b}+\bar{d}) \qquad (2)$$

Gate 3 (an AND gate) with inputs d and a, and output e, contributes:

$$(d+\bar{e})(a+\bar{e})(\bar{a}+\bar{d}+e) \qquad (3)$$

Gate 4 contributes:

$$(\bar{c}+e+f)(c+\bar{e}+f)(c+e+\bar{f})(\bar{c}+\bar{e}+\bar{f}) \qquad (4)$$

A clause with n literals is called an n-clause. Notice that Gate 1 contributes two 2-clauses and one 3-clause. A 2-clause indicates variable dependence. For example, the 2-clause $(a+\bar{c})$ indicates that $a=0 \rightarrow c=0$ and $c=1 \rightarrow a=1$.

The product of all such clauses is the CNF formula for which the SAT solver must find a satisfying variable assignment. Suppose the SAT problem to solve is to find an input assignment that sets f to 0. The corresponding 1-clause added to the formula would then be:

$$(\bar{f}) \qquad (5)$$

A discussion will now follow concerning applying the satisfiability algorithm.

Figure 3:
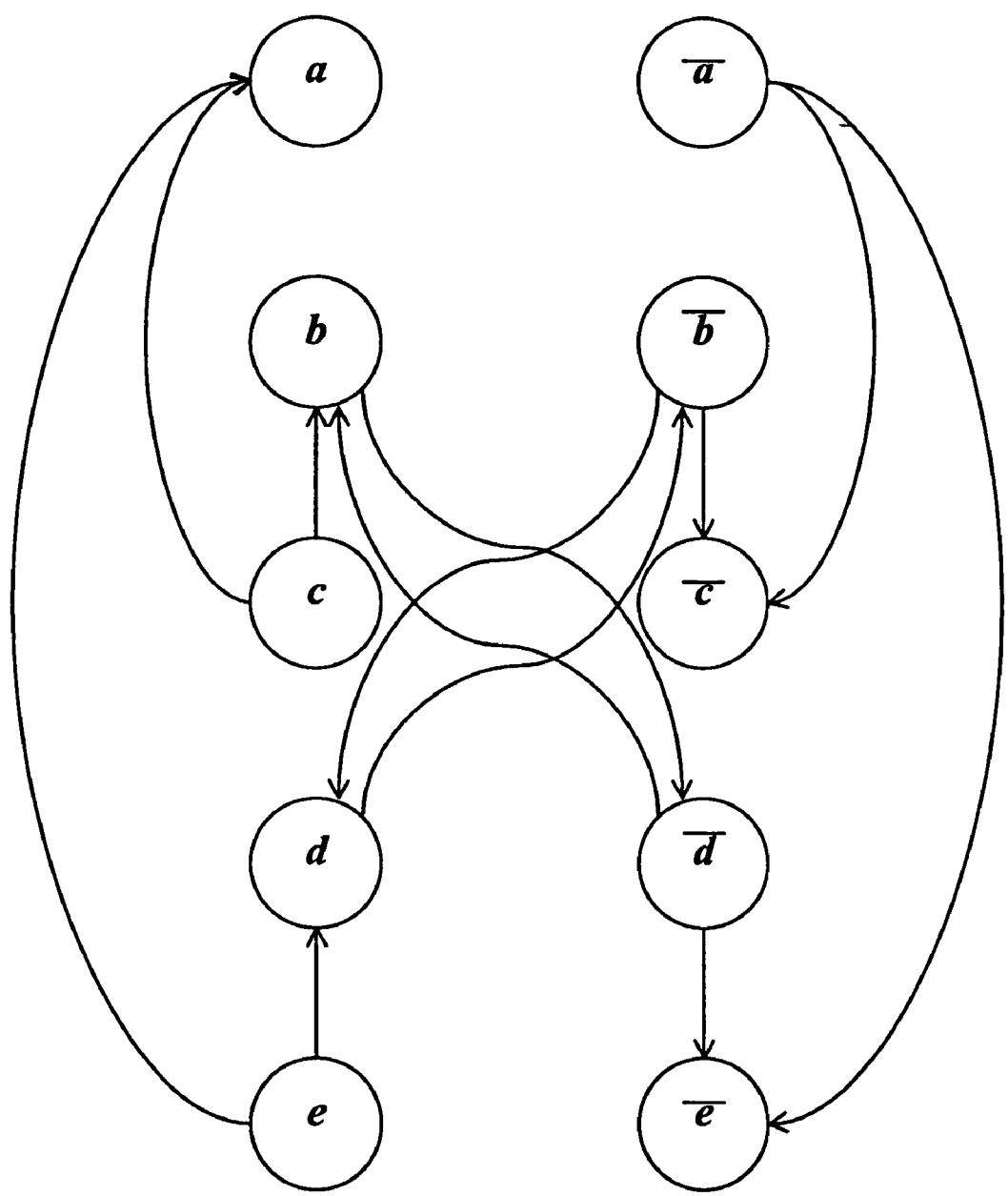
FIG. 3 shows a variable dependency graph.

Before beginning the backtracking procedure to find a satisfying assignment, a data structure is built indicating dependencies between literals arising from 2-clauses. This is illustrated in FIG. 3 for the example circuit of FIG. 2. This data structure will be used to check for implications and contradictions.

In the preprocessing phase, before beginning the backtracking procedure, values corresponding to 1-clauses are imposed. As a result, some clauses may get satisfied and can be removed from the formula, and some clauses may get smaller, possibly creating new 1- and 2-clauses in the process. The creation of new 1-clauses leads to new values that can be imposed, and the creation of 2-clauses leads to new dependencies.

The process is repeated until a fixed point is reached, i.e., there are no more changes to the CNF formula. For example, with the initial condition of (f)=0, it follows that the clauses for gate 4 (see (4) above) simplify as follows:

$$(\bar{c}+e+0)(c+\bar{e}+0)(c+e+1)(\bar{c}+\bar{e}+1) \qquad (6)$$

and yield the following new dependencies:

$$(\bar{c}+e)(c+\bar{e}) \qquad (7)$$

A SAT solver can also try in this phase to find non-local implications between variables in the circuit. This is done by temporarily setting a value for each variable one at a time and "simulating" that value on the CNF formula. Such dependencies are added to the dependencies already extracted from the 2-clauses.

Figure 4:
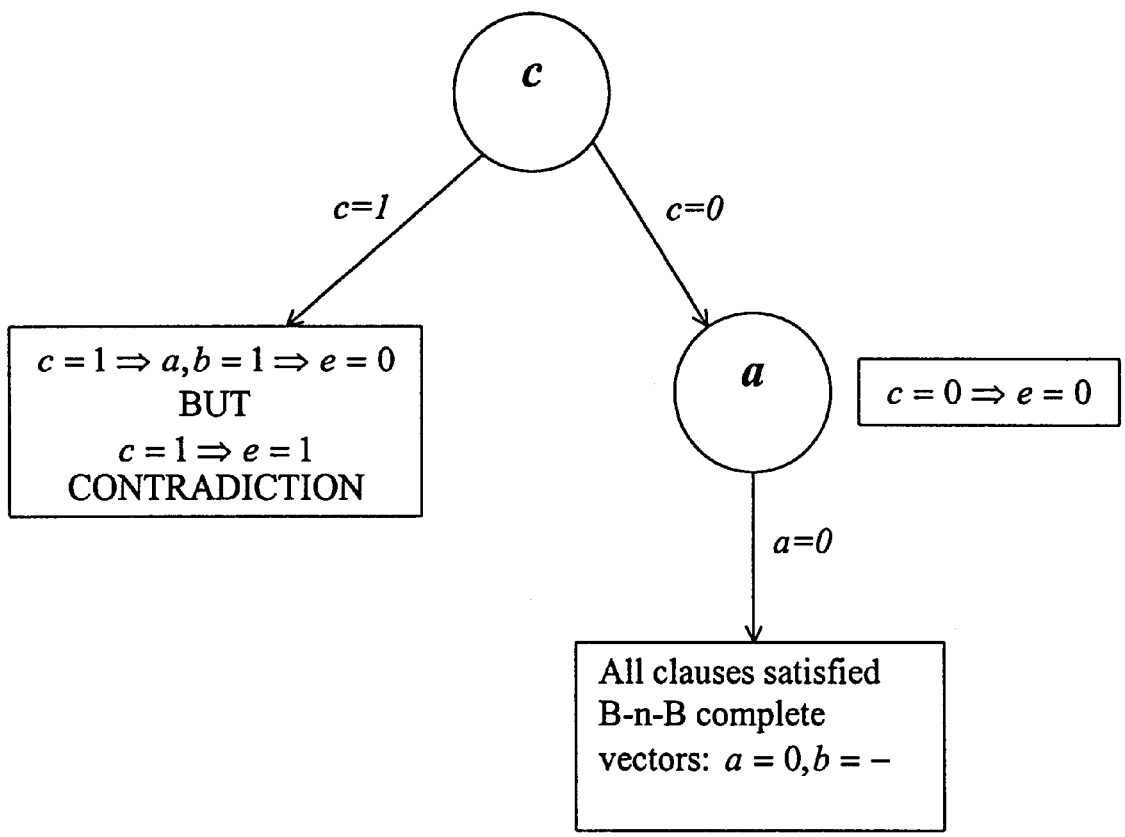
FIG. 4 shows how a variable is bound, and how a branch-and-bound procedure operates.

After this preprocessing, the backtracking branch-and-bound procedure is begun. The execution of this procedure for the present example is shown in FIG. 4. Since this is a very simple example, the formula has only 2-clauses after applying the initial conditions, but it illustrates the essence nevertheless. The Checker first attempts to set the variable c to 1 (i.e., variable c is bound to a value of 1), but it immediately runs into a contradiction by tracing the dependencies transitively on the dependency graph (FIG. 3). Next, it tries the value 0 for the variable c (i.e., the variable c is bound to a value of 0), and succeeds in finding a satisfying assignment a=0, b=–, where "–" represents a don't-care value (i.e., b could be either 0 or 1).

The integration of SAT checking and BDDs now will be discussed.

A BDD is used to capture the fanout partition 40 of the miter circuit 10, and SAT clauses to capture the fanin partition 30. Since the objective is to check whether the miter output can be set to '1', a valid solution of the primary inputs consists of an assignment which both satisfies the SAT clauses and belongs to the onset of the BDD (the BDD onset is the set of values for which the BDD is "on"; i.e., the values for which the BDD produces at its output a '1' or positive value). In other words, there is sought a non-null intersection between the SAT solution and the BDD onset. Note that the BDD and the SAT clauses share those variables that represent nodes on the cutset (i.e., nodes along the boundary 20). These variables are the cutset variables.

In a sense, the BDD can be regarded as a replacement of SAT clauses for the fanout partition 40 which would have appeared in a SAT clause representation of the entire circuit. The reason a BDD can be used in place of SAT clauses is that it directly captures all of the relationships between the miter output z and variables representing other nodes in the fanout partition 40. These dependencies would otherwise have been extracted from the SAT clauses as described above. In principle, it is possible to represent any partition of a circuit with BDDs, and interface it to the rest of the circuit where the rest of the circuit is represented as SAT clauses. The requirement is that BDDs should capture all relationships between variables in that partition and variables at the boundaries. Where a BDD partition is in the middle of a combinational circuit, this requires using a characteristic function to capture the relationships across the BDD partition. In comparison, using a BDD to capture the fanout partition 40 of a single output is relatively easier. In this way, BDDs can directly be used to reduce the size of the original SAT problem not only in the context of verification, as in the above example, but also in other applications based on SAT.

Two general possibilities for combining BDDs with a SAT checker include BDD cube enumeration and SAT solution enumeration. Two possibilities for SAT solution enumeration include a consistency approach and an early bounding approach. Below, BDD cube enumeration is first described, followed by a description of the consistency approach, and then by a description of the early bounding approach.

BDD cube enumeration is first described. Under BDD cube enumeration, each satisfying cube of the BDD is enumerated. Each cube, i.e., a full or partial assignment to the cutset variables, can be interfaced to the SAT checker in the form of 1-clauses which are added to clauses for the remainder of the circuit. The SAT problem is solved independently for each cube. For the present application, if any of these problems results in a solution, the solution is a counter-example for the combinational logic verification problem. In other words, when a 1 (or positive) is produced, there exists an instance in which the two combinational circuits being compared are not equivalent.

The use of BDD cube enumeration has drawbacks. One such drawback is that the number of BDD cubes may be prohibitively large. Another drawback is that the SAT solver repeats work for multiple cubes. Though, in principle, it may be possible to share computation among multiple cubes, no such technique is presently available.

Rather than enumerating the BDD onset, an alternative is to enumerate the SAT solutions instead, and to check whether each of the plurality of solutions belongs to the BDD onset.

Though enumerating the SAT solutions is as expensive as enumerating the BDD onset in principle, its potential advantages are (1) SAT solutions can implicitly be enumerated by using back-tracking techniques, and (2) checking whether a given assignment belongs to the BDD onset is a linear time problem, in comparison to solving a SAT problem for each cube—an NP—hard problem.

Under a consistency approach, the SAT checker proceeds as usual but, whenever it comes back with a solution, it is checked that the assignment to the cutset variables belongs to the BDD onset (see pseudo-code, FIG. 5). In other words, every SAT solution is checked for consistency with the BDD. If the SAT solution does belong to the BDD onset, it is accepted as a valid solution and provides a counter-example to the combinational logic verification problem (i.e., it is accepted as proof that the two combinational circuits are not equivalent). If the SAT solution does not belong to the BDD onset, the last variable assignment in the SAT branch and bound procedure is undone, and backtracking is performed as necessary. This approach does not reduce the number of backtracks or further simplify the SAT solving in any way.

In terms of an implementation, this approach involves minimal changes to an existing SAT Checker. The pseudo-code is as shown in FIG. 5, for the recursive sat_branch procedure, where, for the sake of exposition, the relevant SAT data structure arguments are collectively represented as sat. Whenever there is no new variable to be assigned, i.e., procedure find_next_literal returns NIL, it indicates that a SAT solution has been found. Therefore, a consistency check is performed against the BDD by using check_consistency_with_cutset_bdd. If the check is successful, a valid solution has been found, and we return with success (i.e., proof of non-equivalence). If not, we return with failure, and the calling procedure will undo the last assignment appropriately. The consistency check itself can be performed using standard BDD operations (bdd_substitute or bdd_and) available with standard BDD packages. As an example of a standard BDD package, reference is made to D. E. Long, "BDD Package," 1993, School of Computer Science, Carnegie Mellon University, Pittsburgh, Pa.

The presently preferred embodiment of the invention adopts an early bounding approach. The early bounding approach is now described with reference to FIG. 6 which contains pseudo-code for one possible implementation of this preferred approach.

It will be recalled that the BDD for the fanout partition 40 and the SAT clauses for the fanin partition 30 share the cutset variables. According to the invention, whenever any cutset variable is being bound in the SAT branch-and-bound procedure, the value of the cutset variable and any others presently bound is checked against the BDD. To put it another way, each partial assignment of values to cutset variables is checked for a non-null intersection with the BDD onset. If the partial assignment does intersect the BDD onset in a non-null manner, then the SAT continues to attempt to find a solution by further setting values for the remaining cutset variables.

If, however, the partial assignment does not intersect the BDD onset in a non-null manner, then there is no point in permitting the SAT to attempt to find a SAT solution because any SAT solution arrived at would not check out against the BDD. In other words, where a partial assignment does not intersect the BDD onset, all possible solutions based on that partial assignment can immediately be ruled out. Subsequent branching from that partial assignment is avoided, and thus large subspaces of the decision tree that are inconsistent with the BDD onset are pruned off.

In terms of an implementation, the cutset variable assignments are used to also keep track of the corresponding projections of the BDD onset at any point in the recursive decision tree. The pseudo-codes for the sat bound and sat_branch procedures are shown in FIG. 6. In the sat bound procedure, whenever the variable being bound is a cutset variable, it is projected into the argument BDD using the project_variable_in_bdd procedure. If the resulting BDD is equal to the Zero_bdd, there is a null intersection with the miter BDD, and the process returns with failure. Otherwise, the projected BDD is passed onto the calling procedure. For the sat_branch procedure, note that it merely keeps track of the appropriate BDDs to pass on as arguments to the recursive calls. Since all projections in the BDD are kept consistent with the SAT assignments to the cutset variables, there is no need for a final consistency check when a SAT solution is complete.

As for the project_variable_in_bdd procedure, it can be easily implemented by using either the BDD substitute or the BDD cofactor operation available in standard BDD packages.

The presently preferred embodiment thus is to integrate SAT checking and BDDs by using an early bounding approach to avoid useless SAT solution seeking where partial assignments of cutset variables do not intersect the BDD onset.

In a final embodiment of the invention, the early bounding approach is augmented by special BDD operations.

As mentioned above, the project variable_in_bdd procedure can be implemented by using either the BDD substitute or the BDD cofactor operation available in standard BDD packages. These operations, however, may considerably slow down the SAT procedure for large BDDs. In this particular application, it is interesting to note that once the miter BDD is created, the full set of manipulation capabilities of a BDD package is not really required for the rest of the application. Indeed, the only two operations required are: projection of a variable into a BDD, and checking if a BDD is equal to the Zero_bdd.

Furthermore, each operation is used once when bounding a cutset variable. With standard BDD operations, the former is proportional to the size of the BDD (in the worst case) and the latter is a constant-time operation.

The special BDD operations will now be discussed with reference to FIG. 8. In one preferred implementation, the canonicity property of a BDD is foregone in favor of eliminating the creation of new BDD nodes. There is used a simple association list to keep track of the cutset variable assignments. Projecting (and un-projecting) a variable is accomplished simply by setting (or un-setting) its value in the association. Projecting a variable means setting its value to Boolean 1 or 0; unprojecting a variable means giving it an "invalid" value that indicates that the variable is not set. Variables in the association list may thus be logical 1, 0, or unset. However, checking against a Zero_bdd requires a traversal of the BDD by taking branches dictated by the variable association. If any path to a One_bdd is found, the traversal is terminated, and the BDD is certified not equal to the Zero_BDD. In the worst case, this takes time proportional to the size of the BDD. Thus, without affecting overall complexity, these special operations eliminate the expensive cache-lookups and the unique node table maintenance necessary in standard BDD operations.

The invention thus uses BDDs to reduce the SAT problem size and the number of backtracks (i.e., "backs"); avoids the explicit enumeration of BDD cubes; provides for early bounding during the SAT decision procedure; and uses special BDD operations to improve run-time.

Below, experimental evidence is presented for the improvements obtained by each of these. Towards this end, some experimental results for using the technique of the invention within an iterative framework are provided, where internally equivalent nodes are searched for and replaced successively starting from the primary inputs, much in the style of the techniques described above.

All experiments reported in this section were conducted on a SUN ULTRA workstation, with 128 Mb. main memory. The prototype has been implemented in SIS, which includes the SAT Checker TEGUS, and the CMU BDD package. Additional background information regarding SIS may be found in E. M. Sentovich, K. J. Singh, C. Moon, H. Savoj, R. K. Brayton, and A. Sangiovanni-Vincentelli, "Sequential circuit design using synthesis and optimization," in *Proceedings of the IEEE International Conference on Computer Design*, 1992, a document herein incorporated by reference. More information concerning TEGUS may be found in P. Stephan, R. Brayton, and A. Sangiovanni-Vincentelli, "Combinational Test Generation Using Satisfiability," in *IEEE Transactions on Computer Assisted Design of Integrated Circuits and Systems*, 15(9), September, 1996, which also is incorporated herein by reference for its useful background information.

In terms of benchmark circuits, focus was on the C6288 circuit from the ISCAS suite (for background on the ISCAS suite, reference may be made to F. Brglez, D. Bryan, and K. Kozminski, "Combinational Profiles of Sequential Benchmark Circuits", in *Proceedings of the International Symposium on Circuits and Systems*, Portland, Oreg., May 1989). Focus on this circuit was given since all other ISCAS circuits can be easily handled by BDDs alone (for the C6288, only up until the $13^{th}$ output could be verified using BDDs alone). Furthermore, a non-redundant version of the C6288 can be easily handled by SAT alone. Therefore, a synthesized version of the circuit—C6288_opt—generated by SIS (script.rugged) was used for equivalence checking. All experiments were performed for verification of the output of the miter circuit formed from C6288 and C6288_opt. The BDD was obtained by substituting backwards from the miter output until a BDD node limit of 500 K nodes was reached.

Table 1 summarizes the results for using SAT integrated with BDDs (SAT+BDDs) versus using SAT alone. For both approaches, Column 1 lists the output under consideration, and Column 2 lists the number of nodes/levels in the circuit. For SAT+BDDs, Column 3 lists the level at which the cutset was formed, Column 4 lists the size of the BDD obtained, Column 5 lists the number of nodes/literals in the SAT partition, Column 6 lists the number of backtracks needed, and Column 7 lists the CPU time. For SAT alone, Column 8 lists the number of literals in the entire circuit, Column 9 lists the number of backtracks required, and Column 10 lists the CPU time. For this experiment, a "T" in the columns indicates a timeout after 30 hours (for all outputs).

TABLE 1

Comparison between SAT + BDDs and SAT alone

| Miter | | SAT + BDDs | | | | | SAT alone | | | Backs |
|---|---|---|---|---|---|---|---|---|---|---|
| Output | Nodes/ Levels | Cutset Level | BDD Size K | SAT Nodes/Lits | Backs K | Time sec. | Lits | Backs K | Time sec. | Reduction Factor |
| 9 | 641/49 | 33 | 2 | 271/542 | 20 | 45 | 1282 | 169 | 182 | 8.5 |
| 10 | 810/55 | 39 | 13 | 290/580 | 40 | 132 | 1620 | 442 | 586 | 11.1 |
| 11 | 999/61 | 39 | 13 | 473/946 | 123 | 232 | 1998 | 1535 | 2401 | 12.5 |
| 12 | 1208/67 | 39 | 13 | 682/1364 | 272 | 407 | 2416 | 5907 | 10817 | 21.7 |
| 13 | 1437/73 | 39 | 13 | 911/1822 | 855 | 1112 | 2874 | 23401 | 51111 | 27.4 |
| 14 | 1686/79 | 39 | 13 | 1160/2320 | 3189 | 4189 | 3372 | T | T | — |
| 15 | 1955/85 | 39 | 13 | 1429/2858 | 12532 | 17380 | T | T | T | — |
| 16 | 2244/91 | 39 | 13 | 1718/3436 | 46087 | 82201 | T | T | T | — |

Note that for the first eight outputs (not shown in the table), the SAT Checker was not invoked at all in the SAT+BDDs approach, i.e., the BDD itself was found to be the constant "0". The last column in the table lists the reduction factor for the number of backtracks obtained by SAT+BDDs in comparison to SAT alone. For the outputs that could be verified by both approaches, a reduction factor of up to 27 was obtained. Note also that the former completes verification for up to the $16^{th}$ output, whereas the latter gives up after the $13^{th}$. For this experiment the Early Bounding approach for SAT+BDDs was used. These gains are due both to the reduction of the SAT problem size (compare Columns 5 and 8) and to early bounding of the cutset variables using BDDs.

Table 2 summarizes the results demonstrating the advantages of SAT solution enumeration, with early bounding, using special BDD operations. The first four columns have the same explanation as in Table 1. A "T" in the columns indicates a timeout after 3 hours. Again, for the first eight outputs (not shown in the table), a SAT+BDD checker is not invoked at all.

Column 5 lists the number of BDD cubes that need to be checked, and col. 6 the time taken. For the $9^{th}$ output, the BDD cube enumeration approach did not complete. This is primarily due to the large number—1,250 million—of cubes that need to be enumerated and independently checked. In contrast, the SAT solution enumeration approach could complete up to the $14^{th}$ output in the same amount of time, as shown in col. 8.

Columns 7 and 8 list the number of backtracks and time taken by the early bounding approach, and columns 9 and 10 list these for the consistency approach, respectively. Note that for the outputs available for comparison in the given time limit, the reduction factor in the number of backtracks was up to 34. Since the number of backtracks in the consistency approach parallels that of SAT, this again demonstrates the advantage over the SAT alone.

Finally, columns 8 and 11 list the CPU time taken with the special and standard BDD operations, respectively. Note that within the given time limit, up to a 65% reduction in the time taken was realized. As the BDDs and the SAT partition get larger, such gains are expected to be substantial.

operations of the invention, is supplied on any one of a variety of media. Furthermore, the actual implementation of the approach and operations of the invention are actually statements written in a programming language. Such programming language statements, when executed by a computer, cause the computer to act in accordance with the particular content of the statements. Furthermore, the software that enables a computer system to act in accordance with the invention may be provided in any number of forms including, but not limited to, original source code, assembly code, object code, machine language, compressed or encrypted versions of the foregoing, and any and all equivalents.

One of skill in the art will appreciate that "media", or "computer-readable media", as used here, may include a diskette, a tape, a compact disc, an integrated circuit, a cartridge, a remote transmission via a communications circuit, or any other similar medium useable by computers. For example, to supply software for enabling a computer system to operate in accordance with the invention, the supplier might provide a diskette or might transmit the software in some form via satellite transmission, via a direct telephone link, or via the Internet.

Although the enabling software might be "written on" a diskette, "stored in" an integrated circuit, or "carried over" a communications circuit, it will be appreciated that, for the purposes of this application, the computer usable medium will be referred to as "bearing" the software. Thus, the term "bearing" is intended to encompass the above and all equivalent ways in which software is associated with a computer usable medium.

TABLE 2

Results for SAT Enumeration, with Early Bounding and Special BDD Operations

| | | | | | SAT Enumeration Approach | | | | | |
|---|---|---|---|---|---|---|---|---|---|---|
| Partitioned Miter Circuit | | | BDD Approach | | Early Bounding | | Consistency | | Standard BDD | |
| Out No. | Nodes/ Levels | BDD K | SAT Nodes/Lits | Cubes M | Time sec. | Backs K | Time sec. | Backs K | Time sec. | Time sec. |
| 9 | 641/49 | 2 | 271/542 | 1250 | T | 20 | 45 | 29 | 65 | 80 |
| 10 | 810/55 | 13 | 290/580 | T | T | 40 | 132 | 72 | 198 | 282 |
| 11 | 999/61 | 13 | 473/946 | T | T | 123 | 232 | 4272 | 6726 | 654 |
| 12 | 1208/67 | 13 | 682/1364 | T | T | 272 | 407 | T | T | 1053 |
| 13 | 1437/73 | 13 | 911/1822 | T | T | 855 | 1112 | T | T | 2403 |
| 14 | 1686/79 | 13 | 1160/2320 | T | T | 3189 | 4189 | T | T | T |

The SAT+BDD equivalence technique can also form the core step of an iterative replacement method which (1) searches for candidate equivalent pairs in the miter; (2) attempts to verify the equivalence of each pair; and (3) successively replaces nodes when found equivalent.

In the iterative method according to a last embodiment of the invention, random pattern simulation is used in Step 1 to form a list of candidate equivalent pairs. Step 2 is performed by using SAT+BDDs according to the invention. When applied to the miter circuit for C6288, equivalence could be verified using this approach.

It will be appreciated that the above-identified invention in all of its embodiments may be embodied in a computer system that contains hardware and software enabling it to perform the early bounding approach and the special BDD operations. Similarly, the above-identified invention may be embodied in a computer program product.

On a practical level, the software that enables the computer system to perform the above-identified approach and For the sake of simplicity, therefore, the term "program product" is thus used to refer to a computer useable medium, as defined above, which bears in any form of software to enable a computer system to operate according to the above-identified invention.

Thus, the invention is also embodied in a program product bearing software which enables a computer to perform operations according to the invention.

Finally, as will be readily understood, the invention is embodied in a method of solving the combinational logic verification problem involving the steps set forth above.

The invention is intended to be construed not only with respect to the examples described above, but with respect to any and all equivalents in accordance with the appended claims.

There is claimed:

1. A method for determining non-equivalence between two combinational circuits comprising:

combining the two combinational circuits into a miter circuit;

partitioning the miter circuit along a boundary which separates each of the two combinational circuits into a respective fanin partition and a respective fanout partition, the two combinational circuits having variables including a set of cutset variables defined by the boundary;

defining a binary decision diagram for the respective fanout partitions, the binary decision diagram having a respective binary decision diagram onset;

defining a set of Boolean satisfiability clauses for the respective fanin partitions, the Boolean satisfiability clauses having the cutset variables as an output, the binary decision diagram having the cutset variables as an input;

performing Boolean satisfiability checking to find satisfiability solutions for the set of Boolean satisfiability clauses, including bounding values to the variables included in the set of Boolean satisfiability clauses to define currently bound variables;

whenever one of the variables bound to a value is one of the set of cutset variables, checking the values of the currently bound ones of the set of cutset variables to make a determination as to whether the values of the currently bound ones of the set of cutset variables have a non-null intersection with the binary decision diagram onset;

proceeding forward in the performing of the Boolean satisfiability checking when the determination indicates the non-null intersection; and backtracking in the performing of the Boolean satisfiability checking when the determination indicates the null intersection.

2. The method for determining non-equivalence between two combinational circuits as set forth in claim 1, wherein:

the step of defining a binary decision diagram is performed so as to define a canonical binary decision diagram; and in the step of checking the values of the currently bound ones of the set of cutset variables, the determination is based on the canonical binary decision diagram.

3. The method for determining non-equivalence between two combinational circuits as set forth in claim 1, wherein:

the currently bound ones of the set of cutset variables include a newly bound cutset variable;

the binary decision diagram comprises nodes, including a root node and terminal nodes, there being paths between the root node and the terminal nodes, and edges connecting logically adjacent ones of said nodes along said paths;

the step of checking the values of the currently bound ones of the cutset variables to make a determination is performed by:

preparing an association list associating the values of the currently bound ones of the cutset variables and the nodes;

projecting the newly bound cutset variable onto the binary decision diagram by noting the value of the newly bound cutset variable in the association list; and determining whether there exists one of the paths for which the edges are consistent with the currently bound ones of the cutset variables and for which the terminal node has a predetermined value indicating success; and the step of backtracking includes unprojecting the newly bound cutset variable by setting the corresponding association list value thereof to a predetermined invalid value.

4. A computer system adapted to determine non-equivalence between two combinational circuits, comprising:

a processor, and a memory including software instructions adapted to enable the computer system to perform the steps of:

combining the two combinational circuits into a miter circuit;

partitioning the miter circuit along a boundary which separates each of the two combinational circuits into a respective fanin partition and a respective fanout partition, the two combinational circuits having variables including a set of cutset variables defined by the boundary;

defining a binary decision diagram for the respective fanout partitions, the binary decision diagram having a respective binary decision diagram onset;

defining a set of Boolean satisfiability clauses for the respective fanin partitions, the Boolean satisfiability clauses having the cutset variables as an output, the binary decision diagram having the cutset variables as an input;

performing Boolean satisfiability checking to find satisfiability solutions for the set of Boolean satisfiability clauses, including bounding values to the variables included in the set of Boolean satisfiability clauses to define currently bound variables;

whenever one of the variables bound to a value is one of the set of cutset variables, checking the values of the currently bound ones of the set of cutset variables to make a determination as to whether the values of the currently bound ones of the set of cutset variables have a non-null intersection with the binary decision diagram onset;

proceeding forward in the performing of the Boolean satisfiability checking when the determination indicates the non-null intersection; and backtracking in the performing of the Boolean satisfiability checking when the determination indicates the null intersection.

5. The computer system adapted to determine non-equivalence between two combinational circuits as set forth in claim 4, wherein said memory further includes software instructions adapted to enable the computer system further to:

perform the step of defining a binary decision diagram so as to define a canonical binary decision diagram; and make, in the step of checking the values of the currently bound ones of the set of cutset variables, the determination based on the canonical binary decision diagram.

6. The computer system adapted to determine non-equivalence between two combinational circuits as set forth in claim 4 wherein said software instructions are adapted to enable the computer system to perform so that:

the currently bound ones of the set of cutset variables include a newly bound cutset variable;

the binary decision diagram comprises nodes, including a root node and terminal nodes, there being paths between the root node and the terminal nodes, and edges connecting logically adjacent ones of said nodes along said paths;

the step of checking the values of the currently bound ones of the cutset variables to make a determination is performed by:

preparing an association list associating the values of the currently bound ones of the cutset variables and the nodes;

projecting the newly bound cutset variable onto the binary decision diagram by noting the value of the newly bound cutset variable in the association list; and determining whether there exists one of the paths for which the edges are consistent with the currently bound ones of the cutset variables and for which the terminal node has a predetermined value indicating success; and the step of backtracking includes unprojecting the newly bound cutset variable by setting the corresponding association list value thereof to a predetermined invalid value.

7. A computer program product for enabling a computer to determine non-equivalence between two combinational circuits comprising:

software instructions for enabling the computer to perform predetermined operations, and a computer readable medium bearing the software instructions;

the predetermined operations including the steps of:

combining the two combinational circuits into a miter circuit;

partitioning the miter circuit along a boundary which separates each of the two combinational circuits into a respective fanin partition and a respective fanout partition, the two combinational circuits having variables including a set of cutset variables defined by the boundary;

defining a binary decision diagram for the respective fanout partitions, the binary decision diagram having a respective binary decision diagram onset;

defining a set of Boolean satisfiability clauses for the respective fanin partitions, the Boolean satisfiability clauses having the cutset variables as an output, the binary decision diagram having the cutset variables as an input;

performing Boolean satisfiability checking to find satisfiability solutions for the set of Boolean satisfiability clauses, including bounding values to the variables included in the set of Boolean satisfiability clauses to define currently bound variables;

whenever one of the variables bound to a value is one of the set of cutset variables, checking the values of the currently bound ones of the set of cutset variables to make a determination as to whether the values of the currently bound ones of the set of cutset variables have a non-null intersection with the binary decision diagram onset;

proceeding forward in the performing of the Boolean satisfiability checking when the determination indicates the non-null intersection; and backtracking in the performing of the Boolean satisfiability checking when the determination indicates the null intersection.

8. The computer program product for enabling a computer to determine non-equivalence between two combinational circuits according to claim 7, wherein:

the step of defining a binary decision diagram is performed so as to define a canonical binary decision diagram; and in the step of checking the values of the currently bound ones of the set of cutset variables, the determination is based on the canonical binary decision diagram.

9. The computer program product for enabling a computer to determine non-equivalence between two combinational circuits according to claim 7, wherein said predetermined operations are defined so that:

the currently bound ones of the set of cutset variables include a newly bound cutset variable;

the binary decision diagram comprises nodes, including a root node and terminal nodes, there being paths between the root node and the terminal nodes, and edges connecting logically adjacent ones of said nodes along said paths;

the step of checking the values of the currently bound ones of the cutset variables to make a determination is performed by:

preparing an association list associating the values of the currently bound ones of the cutset variables and the nodes;

projecting the newly bound cutset variable onto the binary decision diagram by noting the value of the newly bound cutset variable in the association list; and determining whether there exists one of the paths for which the edges are consistent with the currently bound ones of the cutset variables and for which the terminal node has a predetermined value indicating success; and the step of backtracking includes unprojecting the newly bound cutset variable by setting the corresponding association list value thereof to a predetermined invalid value.

* * * * *

UNITED STATES PATENT AND TRADEMARK OFFICE
CERTIFICATE OF CORRECTION

PATENT NO.   : 6,026,222
DATED        : February 15, 2000
INVENTOR(S)  : Aarti Gupta It is certified that error appears in the above-identified patent and that said Letters Patent is hereby corrected as shown below:

<u>Column 5:</u>
Line 4 and 5 delete "$f = a \wedge (b \vee c) \wedge d$" insert --$f = a \vee (b \wedge c) \vee d$--.
Line 18, delete "$f_v = (\neg x \vee f_0) \wedge (x \vee f_1)$" insert $f_v = (\neg x \vee f_0) \vee (x \wedge f_1)$--.

Signed and Sealed this

Fourteenth Day of August, 2001

*Attest:*

*Attesting Officer*

NICHOLAS P. GODICI
*Acting Director of the United States Patent and Trademark Office*